(12) United States Patent
Hurwitz et al.

(10) Patent No.: US 9,185,793 B2
(45) Date of Patent: Nov. 10, 2015

(54) MULTILAYER ELECTRONIC STRUCTURE WITH THROUGH THICKNESS COAXIAL STRUCTURES

(75) Inventors: Dror Hurwitz, Zhuhai (CN); Simon Chan, Zhuhai (CN); Alex Huang, Hsin Chu (TW)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 133 days.

(21) Appl. No.: 13/483,185

(22) Filed: May 30, 2012

(65) Prior Publication Data

US 2013/0319738 A1     Dec. 5, 2013

(51) Int. Cl.
  *H05K 1/11*      (2006.01)
  *H05K 1/02*      (2006.01)
  *H01L 23/498*    (2006.01)
  *H05K 3/46*      (2006.01)

(52) U.S. Cl.
  CPC ........ *H05K 1/0222* (2013.01); *H01L 23/49827* (2013.01); *H05K 3/4647* (2013.01); *H01L 2924/0002* (2013.01); *H05K 3/4682* (2013.01); *H05K 2201/10378* (2013.01); *H05K 2203/0384* (2013.01); *Y10T 29/49155* (2015.01)

(58) Field of Classification Search
  CPC ........ H01L 21/48; H01L 23/498; H05K 1/18; H05K 3/46
  USPC ...................... 174/260–262, 257, 258; 29/852
  See application file for complete search history.

(56) References Cited

U.S. PATENT DOCUMENTS

| | | | |
|---|---|---|---|
| 6,262,478 B1 * | 7/2001 | Hurwitz et al. ............... | 257/700 |
| 6,280,640 B1 * | 8/2001 | Hurwitz et al. ............... | 216/15 |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 2004/0021222 A1 * | 2/2004 | Mori ............................. | 257/758 |
| 2006/0027934 A1 * | 2/2006 | Edelstein et al. ............. | 257/774 |
| 2007/0082501 A1 * | 4/2007 | Hurwitz et al. ............... | 438/763 |
| 2007/0096292 A1 * | 5/2007 | Machida ........................ | 257/700 |
| 2007/0194431 A1 * | 8/2007 | Corisis et al. ................. | 257/698 |
| 2008/0185180 A1 | 8/2008 | Cheng et al. | |

* cited by examiner

*Primary Examiner* — Yuriy Semenenko
(74) *Attorney, Agent, or Firm* — Wiggin and Dana LLP; Gregory S. Rosenblatt; Jonathan D. Hall

(57) ABSTRACT

A multilayer electronic structure comprising a plurality of dielectric layers extending in an X-Y plane and comprising at least one coaxial pair of stacked posts extending through at least one dielectric layer in a Z direction that is substantially perpendicular to the X-Y plane, wherein the coaxial pair of stacked via posts comprises a central post surrounded by a torroidal via post separated from the central post by a separating tube of dielectric material.

20 Claims, 4 Drawing Sheets

MULTILAYER ELECTRONIC STRUCTURE WITH THROUGH THICKNESS COAXIAL STRUCTURES

BACKGROUND

1. Field of the Disclosure

The present invention relates to novel interconnect structures including coaxial vias, and methods for fabricating same.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are, however, a number of disadvantages with the drilled & filled via approach:

Since each via is required to be separately drilled, the throughput rate is limited, and the costs of fabricating sophisticated, multi-via IC substrates and interposers becomes prohibitive.

In large arrays it is difficult to produce a high density of high quality vias having different sizes and shapes in close proximity to each other by the drill & fill methodology.

Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues.

The side walls are particularly rough where the dielectric being drilled is a composite material comprising glass or ceramic fibers in a polymer matrix, and this roughness may create additional stray inductances.

The filling process of the drilled via holes is usually achieved by copper electroplating. This metal deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers.

Large via channels are difficult to fill uniformly, especially when they are in proximity to smaller vias within the same interconnecting layer of the interposer or IC substrate design.

Laser drilling is best for creating round via channels. Although slot shaped via channels may be fabricated by laser milling, nevertheless, the range of geometries that may be fabricated by 'drill & fill' is somewhat limited. Fabrication of vias by drill & fill is expensive and it is difficult to evenly and consistently fill the via channels created thereby with copper using the relatively, cost-effective electroplating process.

Although the range of acceptable sizes and reliability is improving over time, the disadvantages described hereinabove are intrinsic to the drill & fill technology and are expected to limit the range of possible via sizes.

An alternative solution that overcomes many of the disadvantages of the drill & fill approach, is to fabricate vias by depositing copper or other metal into a pattern created in a photoresist, using a technology otherwise known as 'pattern plating'.

In pattern plating, a seed layer is first deposited. Then a layer of photoresist is laid down over the seed layer and subsequently exposed to create a pattern, which is selectively removed to leave trenches that expose the seed layer. Via posts are created by depositing copper into the photoresist trenches. The remaining photoresist is then removed, the seed layer is etched away, and a dielectric material that is typically a polymer impregnated glass fiber mat, is laminated thereover and therearound to encase the via posts. Various techniques and processes, such as mechanical grinding, polishing, chemical etching and chemical mechanical polishing may then be used to remove part of the dielectric material and to expose the top of the via posts, allowing building up the next metal layer. Thin process may be referred to as planarizing or as thinning. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photoresist is laid on top of the continuous layer, and a pattern is developed therein. The pattern of developed photoresist is stripped away, selectively exposing the metal thereunder, which may then be etched away. The undeveloped photoresist protects the underlying metal from being etched away, and leaves a pattern of upstanding features and vias.

After stripping away the undeveloped photoresist, a dielectric material, such as a polymer impregnated glass fiber mat, may be laminated around and over the upstanding copper features and/or via posts.

The via layers created by pattern plating or panel plating methodologies described above are typically known as via post layers and feature layers. Copper is a preferred metal for both layers.

It will be appreciated that the general thrust of the microelectronic evolution is directed towards fabricating ever smaller, thinner and lighter and more powerful products having high reliability. The use of thick, cored interconnects, prevents ultra-thin products being attainable. To create ever higher densities of structures in the interconnect IC substrate or interposer, ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround. The first IC die is bondable onto the IC support, and the second IC die is bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of: (A) selecting a first base layer; (B) depositing a first adhesive etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photoresist to the second base layer; (F) etching away the first base layer; (G) removing the protective coating of photoresist; (H) removing the first adhesive etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

A first aspect of the invention is directed to providing a multilayer composite electronic structure comprising a plurality of dielectric layers extending in an X-Y plane and further comprising at least one coaxial pair of stacked posts extending through at least one dielectric layer in a Z direction that is substantially perpendicular to the X-Y plane, wherein the coaxial pair of stacked via posts comprises a central post surrounded by a torroidal post separated from the central post by a separating tube of dielectric material.

In some embodiments, the coaxial pair of stacked posts extends through a plurality of layers of the multilayer stack.

In some embodiments, the central post protrudes over the torroidal post.

In some embodiments, the coaxial pair of stacked posts extends through all layers of the multilayer composite electronic structure.

In some embodiments, the central post has a diameter of at least 30 microns, the torroidal post has an external diameter of at least 150 microns, and the separating tube of dielectric material has a thickness of at least 30 microns.

In some embodiments, each post of the stack of posts comprises a seed layer and an electroplated layer.

In some embodiments, the stack comprises alternating via layers and feature layers.

In some embodiments, the seed layer comprises copper.

In some embodiments, the seed layer further comprises an underlying adhesion layer selected from the group comprising Ti, Cr, Ta, W and combinations thereof.

In some embodiments, the adhesion layer may also serve as an etch barrier, protecting underlying copper from being etched away.

In some embodiments, the electroplated layer comprises copper.

In some embodiments, the dielectric material comprises a polymer.

In some embodiments, the dielectric material further comprises ceramic or glass.

In some embodiments, the polymer is selected from the group comprising polyimide, epoxy, Bismaleimide, Triazine and blends thereof.

In some embodiments, the dielectric material further comprises glass fibers.

In some embodiments, the dielectric material further comprises particle fillers.

A second aspect of the invention is directed to a method of fabricating the multilayer composite electronic structure of claim 1, comprising the steps of:
(a) obtaining a substrate; (b) depositing an etchant resistant barrier layer; (c) depositing a seed layer; (d) depositing a layer of photoresist over the seed layer; (e) exposing the photoresist to form a negative pattern comprising at least one coaxial pair of posts; (f) electroplating a metal layer into the negative pattern; (g) stripping away the photoresist, leaving the at least one coaxial pair of posts upstanding; (h) removing the seed layer; (i) laminating a dielectric material over the at least one coaxial pair of posts in the via layer, and (j) thinning away the dielectric material to expose the metal layer.

The method may further comprise depositing additional layers by repeating steps (c) to (j).

The method may further comprise the step of etching away the substrate.

A variant method of fabricating the multilayer composite electronic structure comprises the steps of (i) obtaining a substrate; (ii) covering the substrate with a etch-resistant barrier layer; (iii) covering the etch-resistant barrier layer with a seed layer; (iv) electroplating a metal panel layer over the seed layer; (v) laying a layer of photoresist over the metal panel layer; (vi) exposing the photoresist to form a pattern including at least one coaxial pair of posts; (vii) etching away the metal layer and seed layer; (viii) stripping away the photoresist leaving the at least one coaxial pair of posts upstanding; (ix) laminating a dielectric material over the at least one coaxial pair of posts in the via layer, and (x) thinning away the dielectric material to expose the metal layer.

The method may further comprise depositing additional layers by repeating steps (iii) to (x).

A third aspect of the invention is directed to an electronic device comprising a multilayer composite electronic structure comprising a plurality of dielectric layers extending in an X-Y plane and comprising at least one coaxial pair of stacked posts extending through at least one dielectric layer in a Z direction that is substantially perpendicular to the X-Y plane, wherein the coaxial pair of stacked via posts comprises a central post surrounded by a torroidal post separated from the central via post by a separating tube of dielectric material.

The term microns or µm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature.

Figure 1:
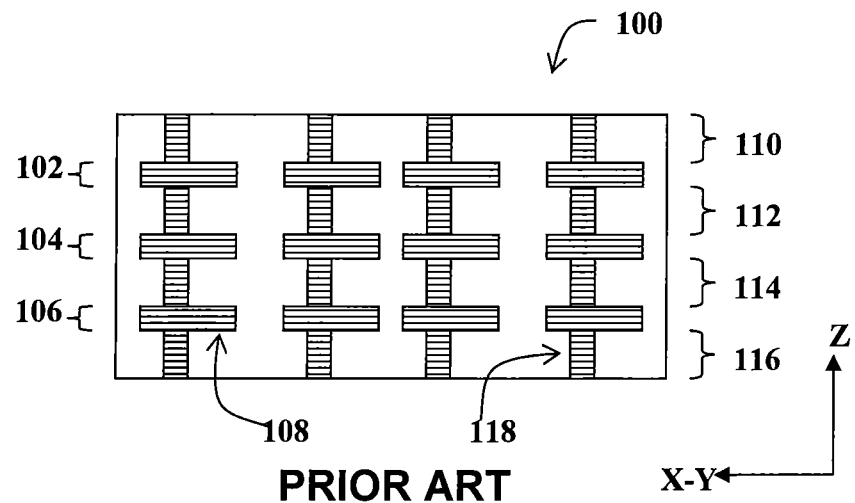
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Amitech (Access') proprietary technology has been found useful for fabricating support structures such as interconnects and printed circuit boards and is used extensively in RF applications, for telephony, communications such as data transfer to and from the Internet, and the like.

It will be appreciated there is essentially no upper size limit for the in-plane dimensions of components created by selective copper deposition (pattern plating) or by plating and etching away.

To facilitate high data transfer rates, conventional copper wiring is limited. One established technology used as a transmission line for radio frequency signals is coaxial cable (Coax). Coaxial cable conducts electrical signals by using an inner conductor that is usually a flexible solid or stranded copper wire which is surrounded by an insulating layer that is itself enclosed by a shield layer that is typically a woven metallic braid. Coaxial cables are often protected by an outer insulating jacket. Normally, the shield is kept at ground potential and a voltage is applied to the center conductor to carry electrical signals. The advantage of coaxial design is that the electric and magnetic fields are confined to the dielectric with little leakage outside the shield whilst simultaneously electric and magnetic fields outside the cable are largely kept from causing interference to signals inside the cable. This property makes coaxial cable a good choice for carrying weak signals that cannot tolerate interference from the environment or for higher electrical signals that must not be allowed to radiate or couple into adjacent structures or circuits.

Common applications of coaxial cable include video and CATV distribution, RF and microwave transmission, and computer and instrumentation data connections. In general, the characteristic impedance of the structure is determined by the dielectric constant of the inner insulator and the radii of the inner and outer conductors.

A controllable characteristic impedance is important because the source and load impedance should be matched to ensure maximum power transfer and minimum Standing Wave Ratio. Other important properties of coaxial structures include attenuation as a function of frequency, voltage handling capability, and shield quality.

One advantage of coax over other types of radio transmission line is that in an ideal coaxial cable the electromagnetic field carrying the signal exists only in the space between the inner and outer conductors. This allows coaxial cable runs to be installed next to metal objects such as gutters without the power losses that occur in other types of transmission lines. Similarly, a coaxial dataline in a substrate or interconnect may prevent power losses, cross-talk and signal radiation. The coaxial structure also provides protection of the signal from external electromagnetic interference. It will therefore be appreciated that with portable equipment running on rechargeable cells and ever increasing data transfer rates, coaxial data lines are a good design choice for many applications.

It will be appreciated that the design choices regarding physical size, frequency performance, attenuation and power handling capabilities of coaxial structures are well understood.

Coaxial signal lines require an internal structure of an insulating (dielectric) material to maintain the spacing between the center conductor and shield. The plating-laminating technology patented by Amitec and now owned Access, provides accurate control of these parameters.

Figure 2:
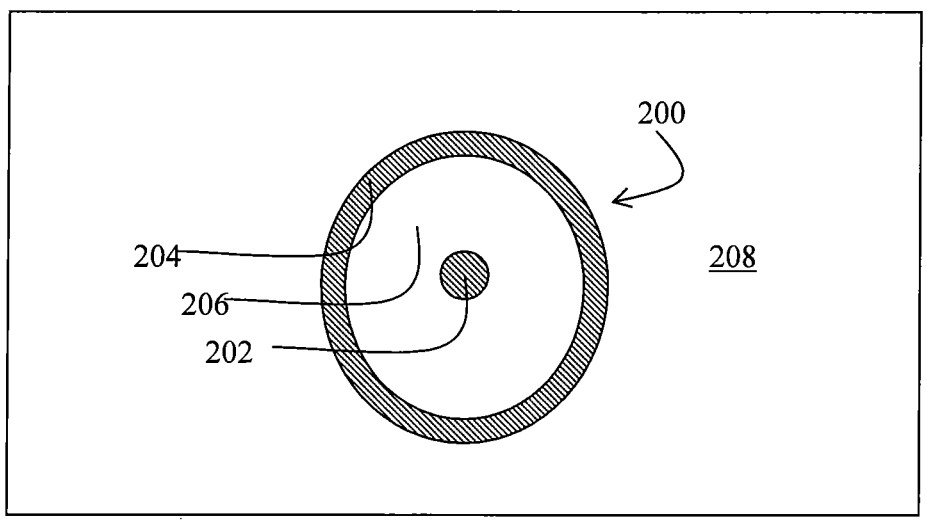
FIG. 2 is a schematic illustration of a coaxial structure that may carry a signal or serve as a data line.

With reference to FIG. 2, a metal core 202 in ring 204 structure separated by a dielectric 206, is shown. This provides a coaxial structure 208 that may carry a signal or serve as a data line.

Using Amitec's technology, coaxial structure 208 may be pattern or panel plated from copper and then a dielectric material 210 may be laminated thereover, providing the insulation 206 surrounding the inner conductor 202 and the insulation 208 surrounding the outer conductor ring 204. The dielectric material used for insulation may be fabricated from a thermoplastic, thermoset, with or without filler and with or without fiber reinforcement.

The dielectric material may comprise a polymer matrix, perhaps polyimide, epoxy, Bismaleimide, Triazine and blends thereof. The dielectric material may further comprises ceramic or glass reinforcements, such as the glass fibers and ceramic particle fillers.

Such materials are available as pre-pregs and may be laid down over a coaxial structure 208 of upstanding coaxial metal posts to create the dielectric insulation 206 separating the inner post 202 from the outer ring post 208.

Possible applications include feed lines and termination layers for feedlines for connecting radio transmitters and receivers with their antennas, computer network (Internet) connections, and distributing cable television signals.

The electro-deposition followed by lamination technology can create coaxial vias and other structures having a continuous frame around a core. Accurate cylindrical construction is possible, as are structures that are far from symmetrical, such as for Faraday shielding, for example.

The dimensions attainable range from tens to hundreds of microns, typically 30 microns to 200 microns, but could be as low as 20 microns for the inner post 202.

The dielectric insulation 206 may have a radius in the range of from 50 to 200 microns. The outer ring post 208 may be 30 microns thick.

An interconnect structure 200 including one or more coaxial connections 210 may be used to couple a die to a coaxial cable. The coaxial connection 210 enables a high data transfer rate, and may be used in various applications such as data networks, Bluetooth, RFID, precise control laser direct imaging, for example.

Figure 3:
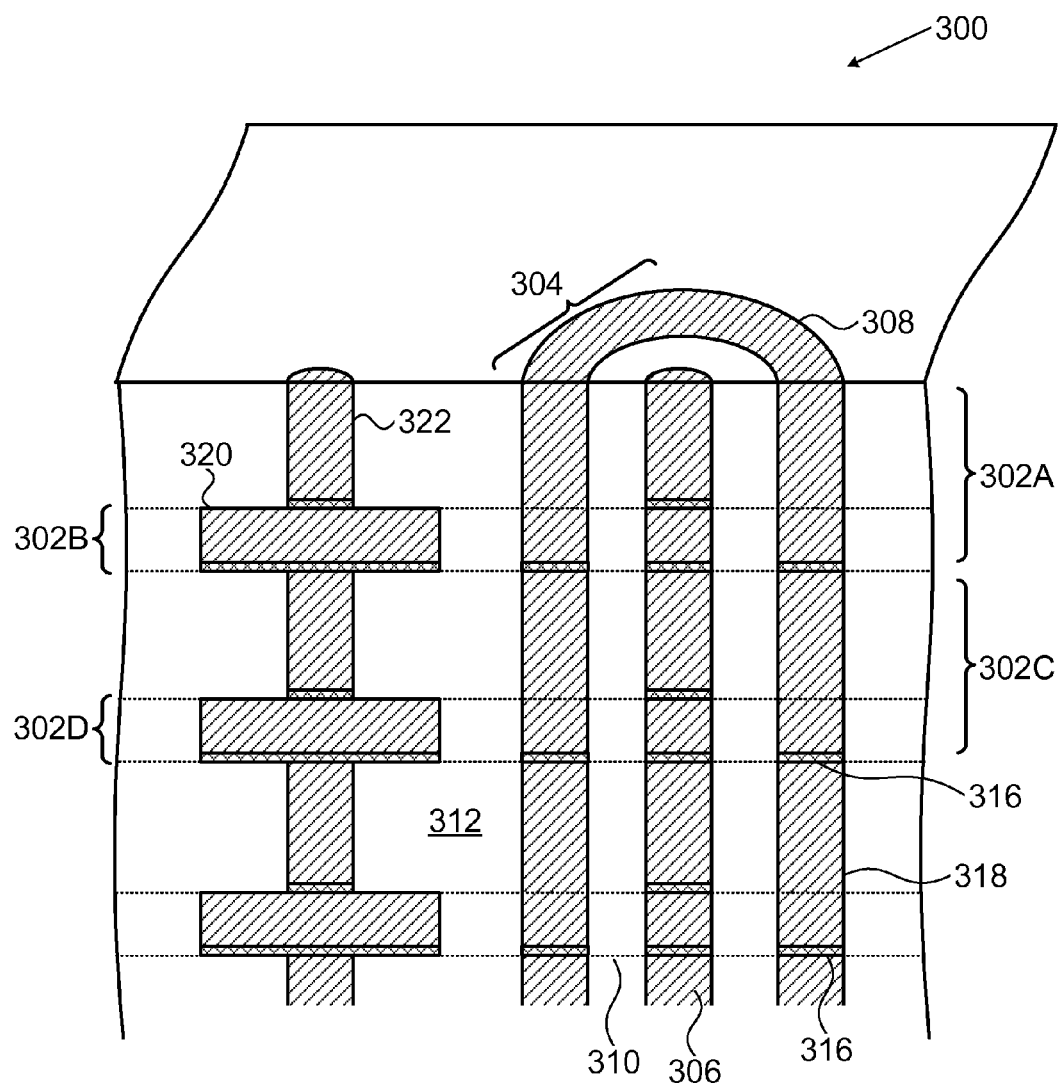
FIG. 3 is a cutaway section through a multilayer composite electronic structure including a stack of coaxial posts.

With reference to FIG. 3, a cut-away section of a multilayer composite electronic structure 300 is shown. The multilayer composite electronic structure 300 is fabricated from a plurality of dielectric layers 302A, 302B, 302C, 302D extending in an X-Y plane, wherein at least some of which, and typically all of which include at least one coaxial pair of posts 304 that extend through the dielectric layer(s) in a Z direction, i.e. the via direction, that is substantially perpendicular to the X-Y plane, wherein the coaxial pair of posts 304 comprises a central post 306 surrounded by a torroidal post 308 separated from the central post 306 by a separating tube 310 of the dielectric material 312. The dielectric material 312 is typically the same material as that of the dielectric layer in which it is found, and is co-fabricated with the rest of the layer.

In some embodiments, the coaxial pair of posts 304 is stacked as a stack of coaxial pairs of posts that extends through a plurality of layers 302 of the multilayer composite electronic structure 300. In some embodiments, the central post 306 extends beyond the torroidal post 308, to facilitate connection to a conductor in the XY plane thereabove. Typically, the stack of coaxial pairs of posts 304 extends through all layers of the multilayer composite electronic structure 300.

In some embodiments, the central post 306 has a diameter of at least 30 microns, the torroidal post 308 has a diameter of at least 150 microns, and the separating tube 310 of dielectric material has a thickness of at least 30 microns.

In some embodiments, each post of the stack of coaxial pairs of posts comprises a seed layer 316, typically of copper, and an electroplated layer 318, also typically of copper.

The multilayer composite electronic structure 300 may, in addition to including one or more stacks of coaxial pairs of posts that provide one or more coaxial data lines 304 or signal paths in the Z direction, i.e. through the thickness of the multilayer composite electronic structure 300, also include other features 320 in feature layers and vias 322 in via layers as known, and perhaps heat sinks, stiffeners and other elements (not shown).

The dielectric material 312 may comprise a polymer matrix, perhaps polyimide, epoxy, Bismaleimide, Triazine and blends thereof. The dielectric material may further comprises ceramic or glass reinforcements, such as glass fibers and ceramic particle fillers. In some embodiments, the dielectric material is applied as a pre-preg comprising woven glass-fibers in a polymer resin.

Figure 4:
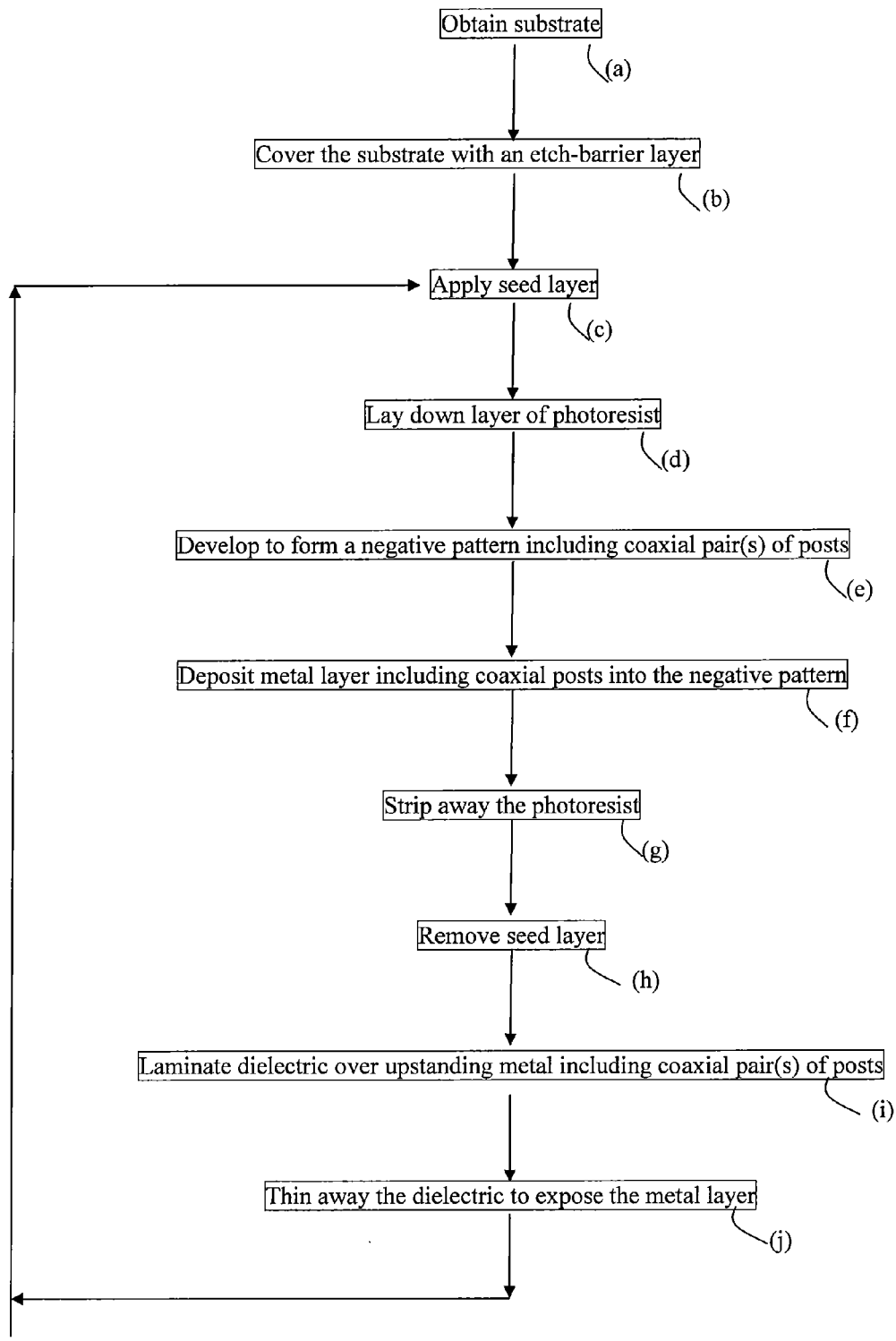
FIG. 4 is a flowchart illustrating one method of creating a layer including a coaxial pair of posts is provided.

With reference to FIG. 4, one method of creating a layer including a coaxial pair of posts comprises the steps of: obtaining a substrate—step (a); covering the substrate with an etch-barrier layer—step (b). The etch-barrier layer may be fabricated from Tantalum, Tungsten, Chromium, Titanium, a Titanium-Tungsten combination, a Titanium-Tantalum combination, Nickel, Gold, a Nickel layer followed by a Gold layer, a gold layer followed by a Nickel layer, Tin, Lead, a Tin layer followed by a Lead layer, Tin-Lead alloy, and Tin Silver alloy and may be applied by a Physical Vapor deposition process. Typically, the etch barrier layer is a metal such as titanium Ti, chromium Cr, tantalum Ta, tungsten W and combinations thereof, for example. Then a seed layer that is typically copper is applied—step (c). The seed layer may be deposited by sputtering or electroless plating for example and is typically 0.5 to 1.5 microns thick. A layer of photoresist may be deposited over the seed layer—(d). The photoresist is then exposed to form a negative pattern comprising at least one coaxial pair of posts—step (e). A metal layer is deposited into the negative pattern—step (f). The photoresist is then stripped away—step (g), leave the at least one coaxial pair of posts upstanding, and the seed layer is removed step (h). This may be accomplished by exposing the structure to a wet etch of ammonium hydroxide or copper chloride, for example. A dielectric material is then laminated over the at least one coaxial pair of posts in the via layer—step (i). The dielectric is then thinned away to expose the metal layer—step (j).

The step of thinning planarizes the structure and exposes the ends of the copper posts by mechanical grinding, polishing or chemical mechanical polishing (CMP) away the dielectric thereover.

Additional layers may be deposited by repeating steps (c) to (j). Optionally, an adhesion layer, typically 0.04 to 0.1 micron of titanium or tantalum is applied.

The substrate may then be etched away; the barrier layer protecting the copper. The barrier layer may then be selectively removed leaving the copper. For example, Ti, W, Ta may be removed using a plasma etch comprising $CF_4/O_2$ or $CF_4/Ar$ to remove selectively leaving Cu. Alternatively, a 1-3% HF solution is very effective in removing Ti, leaving copper. If barrier layer is nickel, a selective nickel stripper as known, may be used.

Figure 5:
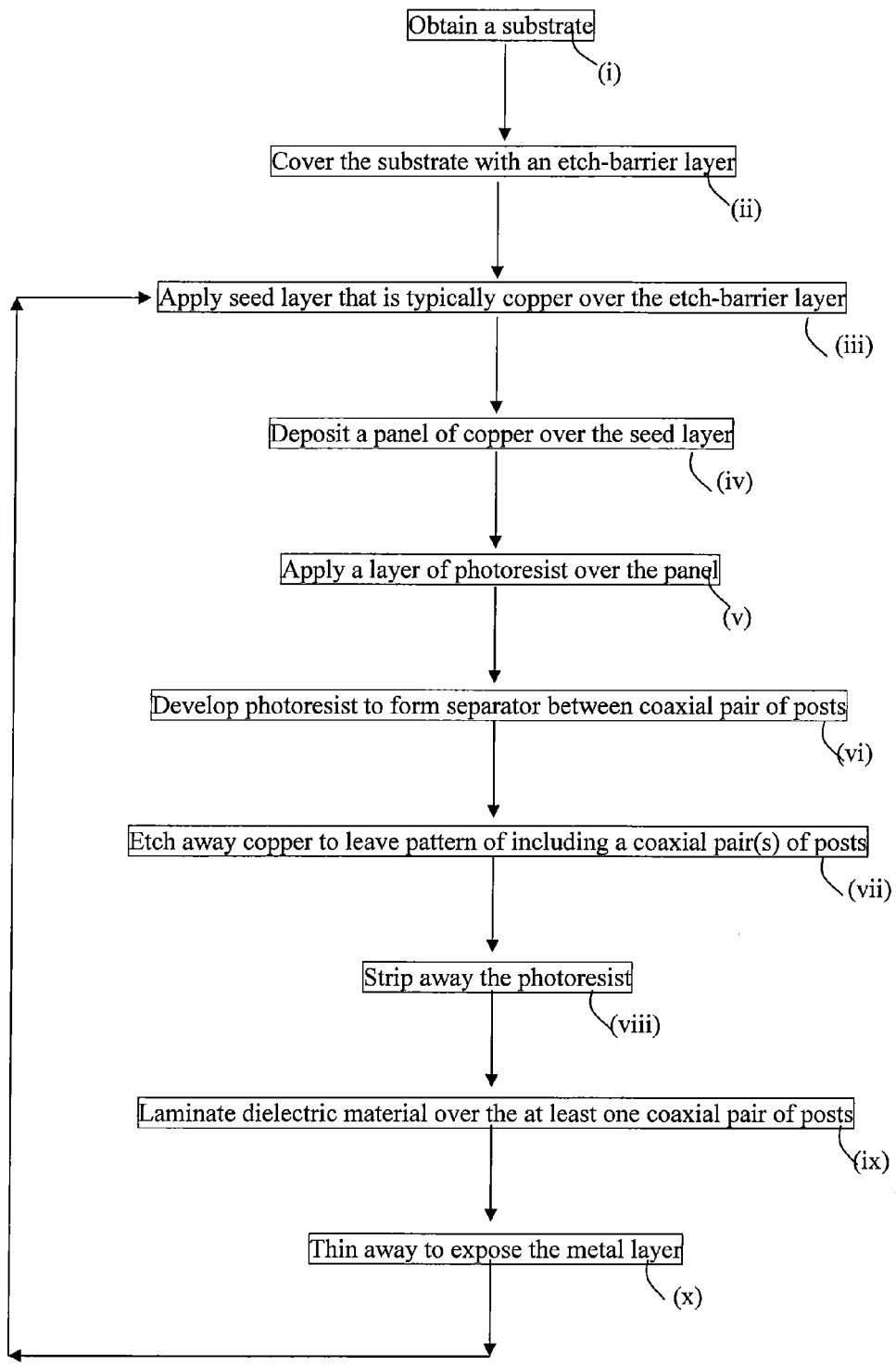
FIG. 5 is a flowchart illustrating a second method of creating a layer including a coaxial pair of posts is provided.

With reference to FIG. 5, an alternative method of creating a layer including a coaxial pair of posts comprises the following steps: obtaining a substrate—step (i) and covering the substrate with an etch-barrier layer—step (ii), which may be selected from the list comprising titanium Ti, chromium Cr, tantalum Ta, tungsten W and combinations thereof, or the other materials mentioned above. A seed layer that is typically copper is then applied over the etch-barrier layer, typically by sputtering or by electroless plating—step (iii). A panel of copper is deposited over the seed layer—step (iv). A layer of photoresist is applied over the panel—step (v). The photoresist is exposed to form a negative pattern of metal posts that comprises at least one separator between a coaxial pair of posts—step (vi). The copper is etched away to leave the pattern of metal posts including at least one coaxial pair of posts upstanding—step (vii). The etching may be accomplished using a wet etch such as ammonium hydroxide or copper chloride, for example. The photoresist is then stripped away—step (viii). Next, a dielectric material is laminated over the at least one coaxial pair of posts—step (ix), and the dielectric material is thinned away to expose the metal layer—step (x). The step of thinning planarizes the structure and exposes the ends of the copper posts by mechanical grinding, polishing or chemical mechanical polishing (CMP) away the dielectric thereover.

Additional layers may be deposited by repeating steps (iii) to (x).

Where depositing a seed layer onto dielectric, an adhesion layer of titanium or tantalum may be first applied. Such an adhesion layer is typically 0.04 microns to 0.1 microns thick.

Leaving the outer layer protected with the dielectric, or with photoresist, the substrate may be etched away; the barrier layer protecting the copper.

A multilayer electronic support structure 300 including coaxial stacked post structures 304 as described herein, may be incorporated into a wide range of electronic devices where fast signaling speeds through the thickness of the multilayer electronic support structure 300 are useful. A multilayer electronic support structure 300 may be used to connect a chip on top of the multilayer electronic support structure to a printed circuit board under the multilayer electronic support structure, for example. One application of co-deposited coaxial features in a support structure is for terminating a coaxial cable or for coupling a component onto a coaxial cable.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A multilayer electronic support structure comprising a plurality of dielectric layers of a dielectric material extending in an X-Y plane and comprising at least one coaxial pair of stacked posts extending through at least one layer of the dielectric material in a Z direction that is perpendicular to the X-Y plane, wherein each of said coaxial pair of stacked via posts comprises a cylindrical central post surrounded by a tubular via post separated from the central post by a separating tube of the dielectric material
   wherein the cylindrical central post and the tubular via post are cofabricated;
   wherein said cylindrical central post is coupled to a voltage source and said tubular via post is coupled to a ground; and
   wherein, in the Z direction, both said cylindrical central post and said tubular via post have a plurality of seed layers separated by electroplated layers.

2. The multilayer electronic support structure of claim 1, wherein the coaxial pair of stacked posts extends through a plurality of layers of the multilayer electronic structure.

3. The multilayer electronic support structure of claim 1, wherein the central post protrudes over the tubular via post in the Z direction.

4. The multilayer electronic support structure of claim 1, wherein the coaxial pair of stacked posts extends through all layers of the multilayer electronic structure.

5. The multilayer electronic support structure of claim 1, wherein the central post has a diameter of at least 30 microns, the tubular via post has an external diameter of at least 150 microns, and the separating tube of the dielectric material has a thickness of at least 30 microns.

6. The multilayer electronic support structure of claim 1, wherein each post of the stack of posts comprises a seed layer and an electroplated layer.

7. The multilayer electronic support structure of claim 6, wherein the seed layer comprises one of the following alternatives:
   (i) an adhesion layer selected from the list comprising Ti, Cr, Ta, W and combinations thereof;
   (ii) an adhesion layer selected from the list comprising Ti, Cr, Ta, W and combinations thereof followed by a copper layer, and (iii) copper.

8. The multilayer composite electronic structure of claim 6, wherein the electroplated layer comprises copper.

9. The multilayer composite structure of claim 1, wherein the dielectric material comprises a polymer.

10. The multilayer composite structure of claim 9, wherein the dielectric material further comprises ceramic or glass reinforcements.

11. The multilayer composite structure of claim 9, wherein the polymer comprises polyimide, epoxy, Bismaleimide, Triazine and blends thereof.

12. The multilayer composite structure of claim 10, wherein the reinforcements comprise glass fibers.

13. The multilayer composite structure of claim 10, wherein the reinforcements comprise particle fillers.

14. An electronic device comprising the multiplayer electronic support structure of claim 1.

15. A method of fabricating the multilayer composite electronic structure of claim 1, comprising the steps of:
   (a) obtaining a substrate;
   (b) covering the substrate with an etch-barrier layer;
   (c) applying a seed layer over the etch-barrier layer;
   (d) depositing a layer of photoresist over the seed layer;
   (e) exposing the photoresist to form a negative pattern comprising at least one coaxial pair of posts;
   (f) depositing a metal layer into the negative pattern;
   (g) stripping away the photoresist, leaving the at least one coaxial pair of posts upstanding including a cofabricated cylindrical central post and tubular via post extending in a Z direction that is perpendicular to the X-Y plane;
   (h) removing the seed layer;
   (i) laminating a dielectric material over the at least one coaxial pair of posts in the via layer, wherein said central post is separated from the tubular via post by a separating tube of dielectric material;
   (j) thinning away the dielectric material to expose the metal layer;
   wherein said cylindrical post is coupled to a voltage source and said tubular via post is coupled to a ground; and wherein, in the Z direction, both said cylindrical central post and said tubular via post have a plurality of seed layers separated by electroplated layers.

16. The method of claim 15 further comprising depositing additional layers by repeating steps (c) to (h).

17. The method of claim 15 further comprising the step of etching away the substrate.

18. A method of fabricating the multilayer composite electronic structure of claim 1, comprising the steps of:
  (i) obtaining a substrate;
  (ii) covering the substrate with an etch-barrier layer;
  (iii) applying a seed layer that is typically copper,
  (iv) depositing a panel of copper over the seed layer;
  (v) applying a layer of photoresist over the panel;
  (vi) exposing the photoresist to form a negative pattern of metal posts that comprises at least one separator between a coaxial pair of posts;
  (vii) etching away the copper to leave the pattern of metal posts including at least one coaxial pair of posts upstanding including a cofabricated cylindrical central post and tubular via post extending in a Z direction that is perpendicular to the X-Y plane;
  (viii) stripping away the photoresist;
  (ix) laminating a dielectric material over the at least one coaxial pair of posts in the via layer, wherein said central post is separated from the tubular via post by a separating tube of dielectric material,
  (x) thinning away the dielectric material to expose the metal layer;
  wherein said cylindrical post is coupled to a voltage source and said tubular via post is coupled to a ground; and
  wherein, in the Z direction, both said cylindrical central post and said tubular via post have a plurality of seed layers separated by electroplated layers.

19. The method of claim 18 further comprising depositing additional layers by repeating steps (iii) to (x).

20. The method of claim 18 further comprising the step of etching away the substrate.

* * * * *